(12) United States Patent
Kim et al.

(10) Patent No.: US 10,267,959 B2
(45) Date of Patent: Apr. 23, 2019

(54) LIGHT SCATTERING FILM AND DISPLAY DEVICE INCLUDING THE SAME

(71) Applicant: SAMSUNG DISPLAY CO., LTD., Yongin-si, Gyeonggi-do (KR)

(72) Inventors: Geebum Kim, Suwon-si (KR); Minwoo Kim, Hwaseong-si (KR); Soomin Baek, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/453,029

(22) Filed: Mar. 8, 2017

(65) Prior Publication Data

US 2017/0261658 A1   Sep. 14, 2017

(30) Foreign Application Priority Data

Mar. 10, 2016 (KR) .................. 10-2016-0028995

(51) Int. Cl.
| | |
|---|---|
| G02B 5/02 | (2006.01) |
| H01L 51/52 | (2006.01) |
| G02B 5/30 | (2006.01) |
| G02F 1/1335 | (2006.01) |
| G02F 1/13363 | (2006.01) |
| H01L 27/32 | (2006.01) |

(52) U.S. Cl.
CPC ......... *G02B 5/0247* (2013.01); *G02B 5/0278* (2013.01); *G02B 5/3083* (2013.01); *G02F 1/13363* (2013.01); *G02F 1/133504* (2013.01); *H01L 27/3244* (2013.01); *H01L 51/5268* (2013.01); *H01L 51/5281* (2013.01)

(58) Field of Classification Search
CPC ............ H01L 51/5268; H01L 51/5262; H01L 51/096; H01L 51/5281; H01L 27/3244; G02B 5/0278; G02B 5/3083; G02B 5/0247; G02B 5/0478; G02F 1/133504
See application file for complete search history.

(56) References Cited

U.S. PATENT DOCUMENTS

| | | | |
|---|---|---|---|
| 2002/0154256 A1* | 10/2002 | Gotoh ............... | G02F 1/133615 349/65 |
| 2004/0141302 A1* | 7/2004 | Koch ..................... | G02B 5/003 362/602 |
| 2005/0030727 A1* | 2/2005 | Shimura .............. | G02B 6/0053 362/23.15 |
| 2005/0151226 A1* | 7/2005 | Takeuchi ............ | H01L 51/5262 257/612 |
| 2006/0146564 A1* | 7/2006 | Lin ...................... | G02B 6/0036 362/606 |

(Continued)

FOREIGN PATENT DOCUMENTS

| KR | 10-2007-0080030 A | 8/2007 |
|---|---|---|
| KR | 2011-17797 A | 1/2011 |

(Continued)

*Primary Examiner* — Caridad Everhart
(74) *Attorney, Agent, or Firm* — Lee & Morse P.C.

(57) ABSTRACT

A light scattering film includes a light transmissive base having a plurality of holes, wherein each of the plurality of holes has a diameter ranging from about 100 nm to about 5 μm, and wherein a gap among adjacent ones of the plurality of holes is about two times to about five times of an average of the diameters of the plurality of holes.

22 Claims, 7 Drawing Sheets

(56) References Cited

U.S. PATENT DOCUMENTS

| | | | |
|---|---|---|---|
| 2007/0284511 A1* | 12/2007 | Toyoda | G02B 3/0075 250/208.1 |
| 2013/0021669 A1* | 1/2013 | Xi | G02B 26/001 359/578 |
| 2013/0027656 A1* | 1/2013 | Escuti | G02B 5/3083 349/193 |
| 2013/0170044 A1* | 7/2013 | Mont | G02B 1/10 359/580 |
| 2015/0049388 A1* | 2/2015 | Tsuji | G02B 5/0242 359/599 |
| 2015/0102325 A1 | 4/2015 | Lim et al. | |
| 2015/0166395 A1* | 6/2015 | Marjanovic | B23K 26/0057 428/131 |
| 2015/0171373 A1* | 6/2015 | Hirasawa | G02B 5/1866 257/40 |

FOREIGN PATENT DOCUMENTS

| | | |
|---|---|---|
| KR | 10-2015-0042937 A | 4/2015 |
| WO | WO 2006/112358 A1 | 10/2006 |

* cited by examiner

LIGHT SCATTERING FILM AND DISPLAY DEVICE INCLUDING THE SAME

CROSS-REFERENCE TO RELATED APPLICATION

Korean Patent Application No. 10-2016-0028995, filed on Mar. 10, 2016, in the Korean Intellectual Property Office, and entitled: "Light Scattering Film and Display Device Comprising the Same," is incorporated by reference herein in its entirety.

BACKGROUND

1. Field

Exemplary embodiments relate to a light scattering film, a polarization film including the light scattering film, and a display device including the light scattering film.

2. Description of the Related Art

In recent times, flat panel display ("FPD") devices which display an image using, e.g., a liquid crystal display ("LCD") panel, a plasma display panel ("PDP"), an electroluminescence ("EL") display panel, and an organic light emitting diode ("OLED") display panel, are garnering attention. Such a display device may include various optical films to improve display properties. Examples of the optical films may include a light scattering film and a polarization film.

SUMMARY

According to an exemplary embodiment, a light scattering film may include a light transmissive base having a plurality of holes. Each of the holes has a diameter ranging from about 100 nm to about 5 µm, and a gap among the holes is about twice to about five times of an average diameter of the holes.

The plurality of holes may have a density ranging from about $1 \times 10^7/cm^2$ to about $5 \times 10^8/cm^2$.

A central axis of the hole may have an inclination angle with respect to a normal line of the light transmissive base.

The inclination angle may be in a range from about 20° to about 40°.

The plurality of holes may include: a first inclined hole having a first inclination angle with respect to a normal line of the light transmissive base; and a second inclined hole having a second inclination angle with respect to the normal line of the light transmissive base.

The first inclined hole and the second inclined hole may intersect each other.

The hole may have a curved portion along a thickness direction of the light transmissive base.

The light transmissive base may include at least one of a polyimide (PI)-based resin, a polyethylene terephthalate (PET)-based resin, a polyester (PE)-based resin, a polystyrene (PS)-based resin, an acrylic resin, a polycarbonate (PC)-based resin, and a cycloolefin polymer (COP).

According to an exemplary embodiment, a light scattering film may include a light transmissive base having a plurality of first recessed portions defined in a first surface. The first recessed portion has a less depth than a thickness of the light transmissive base; and the first recessed portion has a diameter ranging from about 100 nm to about 5 µm.

A gap among the first recessed portions may be about twice to about five times of an average diameter of the first recessed portions.

The light transmissive base may further have a plurality of second recessed portions defined in a second surface, the second recessed portion may have a less depth than the thickness of the light transmissive base; and the second recessed portion may have a diameter ranging from about 100 nm to about 5 µm.

According to an exemplary embodiment, a polarization film may include a polarizer; and a light scattering film on the polarizer. The polarizer includes a linear polarizer and a retardation plate on the linear polarizer, the light scattering film includes a light transmissive base having a plurality of holes, and each of the holes has a diameter ranging from about 100 nm to about 5 µm.

The retardation plate may include a quarter wave plate.

The retardation plate may further include a half wave plate.

A gap among the holes may be about twice to about five times of an average diameter of the holes.

The plurality of holes may have a density ranging from about $1 \times 10^7/cm^2$ to about $5 \times 10^8/cm^2$.

A central axis of the hole may have an inclination angle with respect to a normal line of the light transmissive base.

According to an exemplary embodiment, a display device may include a display panel; and a light scattering film in a display area of the display panel. The light scattering film includes a light transmissive base having a plurality of holes, each of the holes has a diameter ranging from about 100 nm to about 5 µm, and a gap among the holes is about twice to about five times of an average diameter of the holes.

The display panel may include a substrate; a first electrode on the substrate; a light emitting layer on the first electrode; and a second electrode on the light emitting layer.

The display device may further include a polarizer between the display panel and the light scattering film.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "below" another layer, it can be directly below, or one or more intervening layers may also be present. In addition, it will also be understood that when a layer is referred to as being "between" two layers, it can be the only layer between the two layers, or one or more intervening layers may also be present. Like reference numerals refer to like elements throughout.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means in an acceptable range of deviation for the particular value as determined by one of ordinary skill in the art, considering the measurement in question and the error associated with measurement of the particular quantity (i.e., the limitations of the measurement system). For example, "about" can mean in one or more standard deviations, or in ±30%, 20%, 10%, 5% of the stated value.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, an exemplary embodiment will be described with reference to FIGS. 1, 2A, and 2B.

Figure 1:
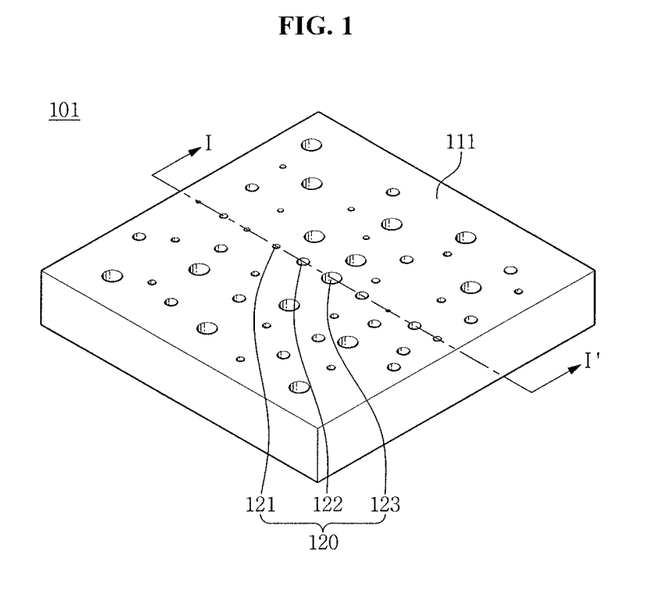
FIG. 1 illustrates a perspective view of a light scattering film according to an exemplary embodiment.
Figure 2A:
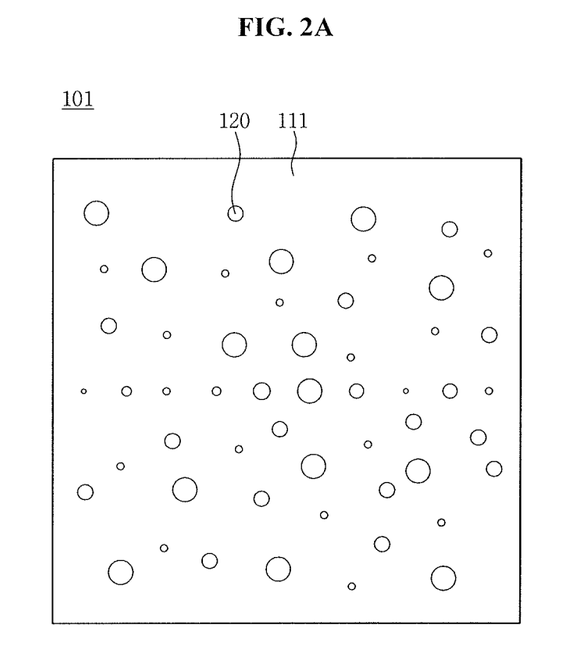
FIG. 2A illustrates a plan view of FIG. 1.
Figure 2B:
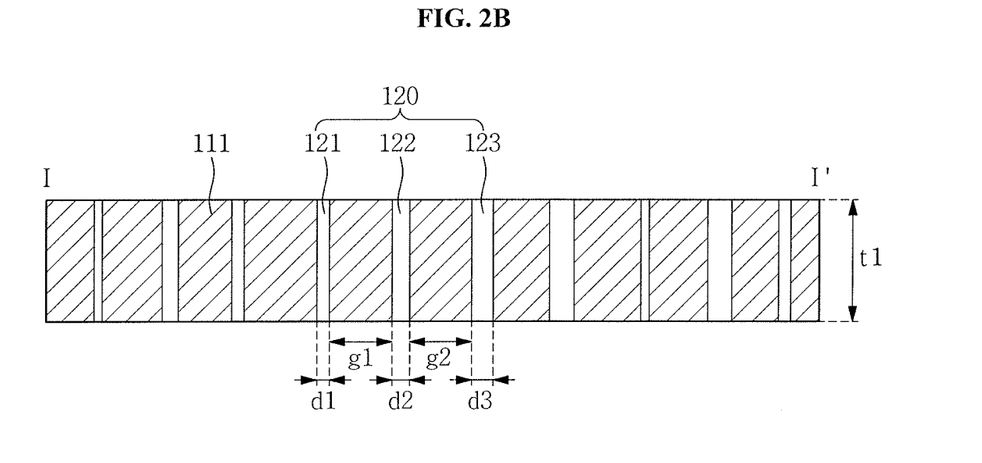
FIG. 2B illustrates a cross-sectional view taken along line I-P of FIG. 1.

FIG. 1 is a perspective view illustrating a light scattering film 101 according to an exemplary embodiment, FIG. 2A is a plan view of FIG. 1, and FIG. 2B is a cross-sectional view taken along line I-I' of FIG. 1.

Referring to FIGS. 1-2B, the light scattering film 101 according to an exemplary embodiment may include a light transmissive base 111 with a plurality of holes 120. For example, as illustrated in FIG. 2B, the plurality of holes 120 may extend through the light transmissive base 111, e.g., through an entire thickness t1 of the light transmissive base 111. For example, each of the holes 120 has a diameter ranging from about 100 nm to about 5 μm, and a gap among the holes 120 is about twice to about five times of an average diameter of the holes 120, e.g., the average diameter refers to a value representing an average of all the diameters in the light transmissive base 111 by dividing a sum of all the diameters by a total number of diameters. The plurality of holes 120 may have a density ranging from about $1 \times 10^7 / cm^2$ to about $5 \times 10^8 / cm^2$.

The light scattering film 101 according to the exemplary embodiment may further include a protection film and a hard coating layer on the light transmissive base 111.

The light transmissive base 111 may include a light transmissive resin through which light may be transmitted. Any material having light transmittance may be used as the light transmissive base 111 without limitation. For example, the light transmissive base 111 may include at least one of a polyimide (PI)-based resin, a polyethylene terephthalate (PET)-based resin, a polyester (PE)-based resin, a polystyrene (PS)-based resin, an acrylic resin, a polycarbonate (PC)-based resin, and a cycloolefin polymer (COP).

The light transmissive base 111 may have a refractive index ranging from about 1.4 to about 2.2. Further, the hole 120 may be filled with a gas, e.g., air, and the gas may have a refractive index ranging from about 1.0 to about 1.3. Due to the refractive-index difference between the light transmissive base 111 and the gas inside the hole 120, a light path and a degree of light diffusion may change at a side wall of the hole 120, and thus, light transmitted through the light transmissive base 111 may be scattered. Accordingly, light transmitted through the light transmissive base 111 may have a high haze value.

Due to the light scattering, a collimated light and a diffused light transmitted through the light scattering film 101 may be efficiently mixed, and luminance distribution of side light, i.e., light emitted toward a side surface of a display device, may change. Accordingly, a difference between front visibility and side visibility is reduced in a display device including the light scattering film 101 according to the first exemplary embodiment, and the side visibility may be improved. In addition, color shift of the side light emitted from the display device including the light scattering film 101 according to the first exemplary embodiment, i.e., white angular dependency (WAD) of a white color, may be reduced.

In an exemplary embodiment, by adjusting the refractive index of the light transmissive base 111, the diameter of the holes 120, the gap between the holes 120, and the shape of the holes 120, light scattering characteristics and haze value of the light scattering film 101 including the light transmissive base 111 may be adjusted.

The light transmissive base 111 may have the thickness t1 ranging from about 20 µm to about 200 µm. In a case where the light transmissive base 111 has a thickness of about 20 µm or more, the light scattering film 101 may have stable mechanical characteristics and heat resistance. In addition, in a case where the light transmissive base 111 has a thickness of about 200 µm or less, the light scattering film 101 may have flexibility, and a display device including the light scattering film 101 may achieve a thin structure.

As discussed previously, the holes 120 defined in the light transmissive base 111 may have varying diameters. For example, the holes 120 may include a first hole 121 having a first diameter d1, a second hole 122 having a second diameter d2, and a third hole 123 having a third diameter d3. The respective first through third diameters d1, d2, and d3 of the holes 121, 122, and 123 may be the same as or different from one another, e.g., every two adjacent holes 120 may have different diameters. In addition, gaps g1 and g2 among adjacent respective ones of the holes 121, 122, and 123 may be the same as or different from one another. As further illustrated in FIG. 2A, the first through third holes 121, 122, and 123 may be arranged in any convenient, e.g., random, pattern in the light transmissive base 111.

Figure 3:
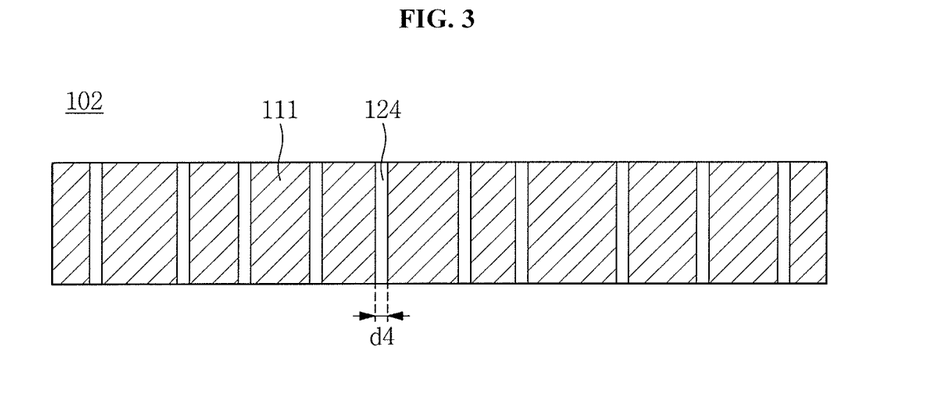
FIG. 3 illustrates a cross-sectional view of a light scattering film according to another exemplary embodiment.

Hereinafter, another exemplary embodiment will be described with reference to FIG. 3. FIG. 3 is a cross-sectional view illustrating a light scattering film 102 according to another exemplary embodiment.

Referring to FIG. 3, the light scattering film 102 may be substantially the same as the light scattering film 101 described previously with reference to FIGS. 1-2B, with the exception that diameters d4 of holes 124 defined in the light transmissive base 111 according to the exemplary embodiment are the same as one another. However, gaps among adjacent ones of the holes 124 may be the same as or different from one another.

Due to the holes 124 defined in such a manner, the light scattering film 102 may induce irregular light scattering. Due to the irregular light scattering, light scattering efficiency may be improved.

Figure 4:
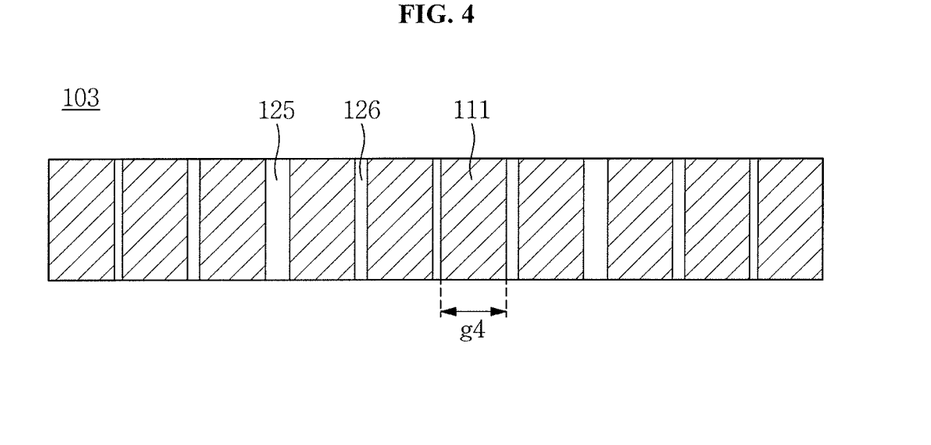
FIG. 4 illustrates a cross-sectional view of a light scattering film according to another exemplary embodiment.

Hereinafter, another exemplary embodiment will be described with reference to FIG. 4. FIG. 4 is a cross-sectional view illustrating a light scattering film 103 according to another exemplary embodiment.

Referring to FIG. 4, the light scattering film 103 may be substantially the same as the light scattering film 101 described previously with reference to FIGS. 1-2B, with the exception that gaps g4 among adjacent holes are the same as one another.

That is, diameters of holes 125 and 126 defined in the light transmissive base 111 according to the exemplary embodiment may be the same as or different from one another. However, the gaps g4 among adjacent ones of the holes 125 and 126 are the same as one another.

Due to the holes 125 and 126 having different diameters, the light scattering film 103 may induce irregular light scattering. Due to the irregular light scattering, luminance distribution of side light may change and a collimated light and a diffused light transmitted through the light scattering film 103 may be efficiently mixed.

Figure 5:
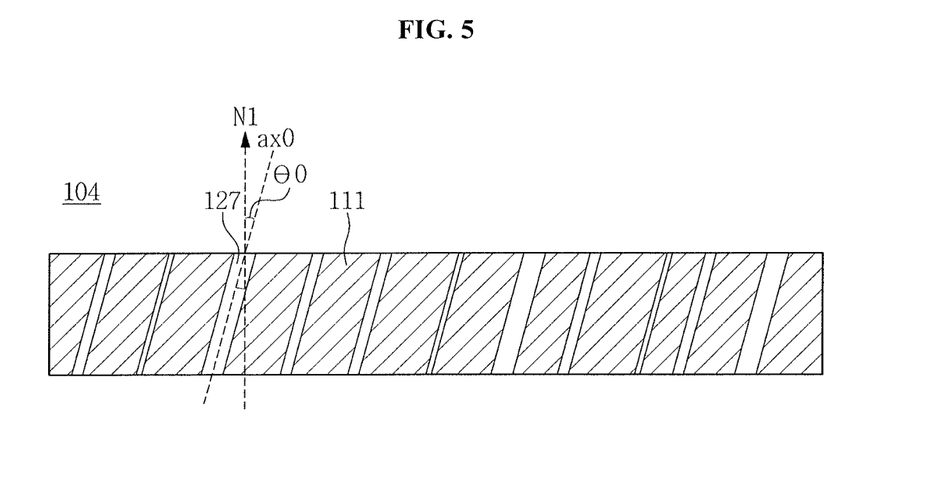
FIG. 5 illustrates a cross-sectional view of a light scattering film according to another exemplary embodiment.

Hereinafter, another exemplary embodiment will be described with reference to FIG. 5. FIG. 5 is a cross-sectional view illustrating a light scattering film 104 according to another exemplary embodiment.

Referring to FIG. 5, the light scattering film 104 may be substantially the same as the light scattering film 101 described previously with reference to FIGS. 1-2B, with the exception that holes 127 through the light transmissive base 111 may be inclined.

That is, the holes 127 defined in the light transmissive base 111 according to the exemplary embodiment may be inclined, e.g., at an oblique angle, with respect to a surface of the light transmissive base 111. For example, a central axis ax0 of the hole 127 defined in the light transmissive base 111 has an inclination angle $\theta 0$ with respect to a normal line N1 to the light transmissive base 111. Herein, the normal line N1 of the light transmissive base 111 is a straight line perpendicular to the surface of the light transmissive base 111, and the inclination angle $\theta 0$ of the hole 127 is an angle between the central axis ax0 of the hole 127 and the normal line N1 of the light transmissive base 111. The inclination angle $\theta 0$ is in a range of about 20° to about 40°, e.g., the inclination angle $\theta 0$ may be the same in all the holes 127.

As the hole 127 is inclined, a light (front light) which propagates from the front to the rear of the light scattering film 104, i.e., in a direction parallel to a direction from a front to a rear of a display panel, is more likely to pass through the hole 127, and accordingly, light scattering efficiency of the front light may be improved. The diameters and gaps between the holes 127 may vary, as discussed previously with reference to FIGS. 1-2B.

Figure 6:
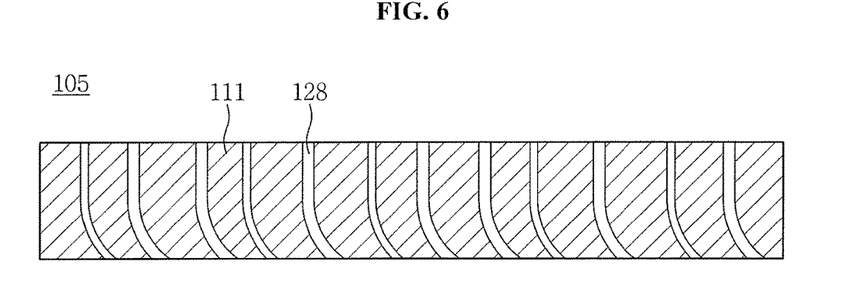
FIG. 6 illustrates a cross-sectional view of a light scattering film according to another exemplary embodiment.

Hereinafter, another exemplary embodiment will be described with reference to FIG. 6. FIG. 6 is a cross-sectional view illustrating a light scattering film 105 according to another exemplary embodiment.

Referring to FIG. 6, the light scattering film 105 may be substantially the same as the light scattering film 101 described previously with reference to FIGS. 1-2B, with the exception that holes 128 through the light transmissive base 111 include a curve.

That is, the holes 128 defined in the light transmissive base 111 according to the exemplary embodiment have a curved portion along a thickness direction of the light transmissive base 111. For example, referring to FIG. 6, the hole 128 defined in the light transmissive base 111 has the curved portion in a lower portion of the drawings.

When the hole 128 has such a curved portion, a light (front light) which propagates from the front to the rear of the light scattering film 105 is more likely to pass through the curved portion of the hole 128, and accordingly, light scattering efficiency of the front light may be improved.

Figure 7:
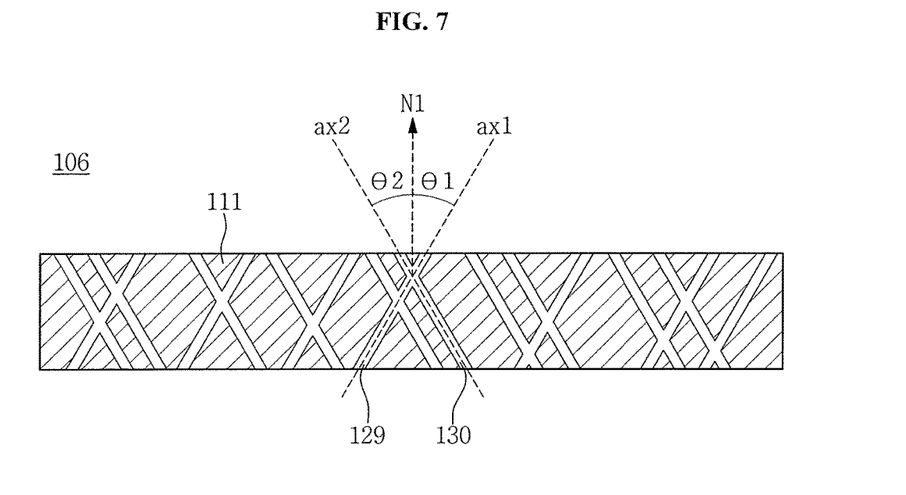
FIG. 7 illustrates a cross-sectional view of a light scattering film according to another exemplary embodiment.

Hereinafter, another exemplary embodiment will be described with reference to FIG. 7. FIG. 7 is a cross-sectional view illustrating a light scattering film 106 according to another exemplary embodiment.

Referring to FIG. 7, the light scattering film 106 may be substantially the same as the light scattering film 101 described previously with reference to FIGS. 1-2B, with the exception that holes 129 and 130 through the light transmissive base 111 may be inclined at different angles.

That is, the holes 129 and 130 defined in the light transmissive base 111 are inclined with respect to the normal line N1 of the light transmissive base 111. Hereinafter, the holes 129 and 130, each having different inclination angles, are to be referred to as a first inclined hole 129 and a second inclined hole 130, respectively.

The first inclined hole 129 has a first inclination angle $\theta 1$ with respect to the normal line N1 of the light transmissive base 111. That is, a central axis ax1 of the first inclined hole 129 has the first inclination angle $\theta 1$ with respect to the normal line N1 of the light transmissive base 111.

The second inclined hole 130 has a second inclination angle $\theta 2$ with respect to the normal line N1 of the light transmissive base 111. That is, a central axis ax2 of the second inclined hole 130 has a second inclination angle θ2 with respect to the normal line N1 of the light transmissive base 111.

Referring to FIG. 7, the first inclined hole 129 and the second inclined hole 130 intersect each other within the light transmissive base 111. As such, as the light transmissive base 111 has the first inclined hole 129 and the second inclined hole 130, light scattering efficiency of light (front light) which propagates from the front to the rear of the light scattering film 106 may increase. Accordingly, luminance distribution of side light may change, and a collimated light and a diffused light transmitted through the light scattering film 106 may be efficiently mixed. Accordingly, a difference between front visibility and side visibility may decrease in a display device including the light scattering film 106.

Figure 8:
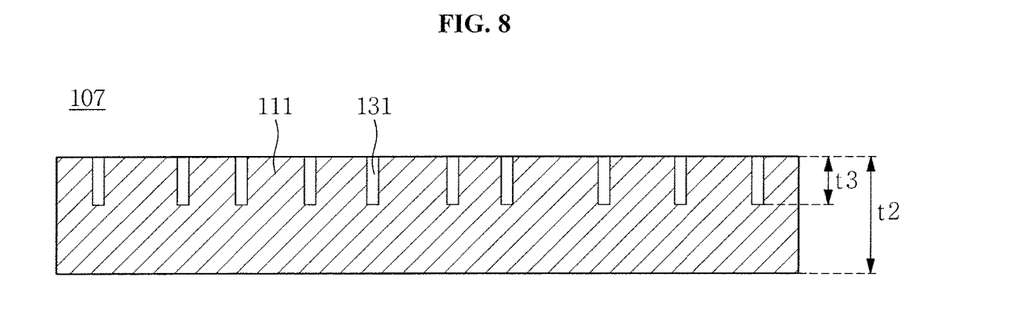
FIG. 8 illustrates a cross-sectional view of a light scattering film according to another exemplary embodiment.

Hereinafter, another exemplary embodiment will be described with reference to FIG. 8. FIG. 8 is a cross-sectional view illustrating a light scattering film 107 according to another exemplary embodiment.

Referring to FIG. 8, the light scattering film 107 may be substantially the same as the light scattering film 101 described previously with reference to FIGS. 1-2B, with the exception that holes through the light transmissive base 111 are recessed portions 131 that only partially extend through a thickness of the light scattering film 101.

That is, the recessed portion 131 has a smaller depth t3 than a thickness t2 of the light transmissive base 111. In addition, the recessed portion 131 has a diameter ranging from about 100 nm to about 5 μm, and a gap among the recessed portions 131 may be about twice to about five times of an average diameter of the recessed portions 131. The recessed portion 131 is filled with a gas, e.g., air, and due to a refractive-index difference between the gas and the light transmissive base 111, light transmitted through the light scattering film 107 may be scattered.

Figure 9:
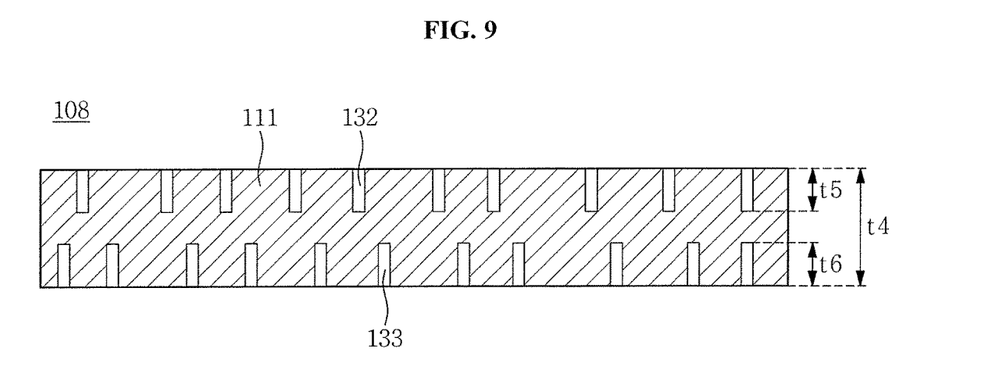
FIG. 9 illustrates a cross-sectional view of a light scattering film according to another exemplary embodiment.

Hereinafter, another exemplary embodiment will be described with reference to FIG. 9. FIG. 9 is a cross-sectional view illustrating a light scattering film 108 according to another exemplary embodiment.

Referring to FIG. 9, the light scattering film 108 may be substantially the same as the light scattering film 107 described previously with reference to FIG. 8, with the exception that recessed portions are formed on opposite surfaces of the light transmissive base 111.

That is, the light transmissive base 111 has a plurality of first recessed portions 132 defined in a first surface. In FIG. 9, the first surface of the light transmissive base 111 corresponds to an upper surface of the light transmissive base 111.

The first recessed portion 132 has a smaller depth t5 than a thickness t4 of the light transmissive base 111, and has a diameter ranging from about 100 nm to about 5 μm. A gap among the first recessed portions 132 may be about twice to about five times of an average diameter of the first recessed portions 132.

The light transmissive base 111 according to the exemplary embodiment has also a plurality of second recessed portions 133 defined in a second surface. In FIG. 9, the second surface is opposite the first surface.

The second recessed portion 133 has a smaller depth t6 than the thickness t4 of the light transmissive base 111, and has a diameter ranging from about 100 nm to about 5 μm. A gap among the second recessed portions 133 may be about twice to about five times of an average diameter of the second recessed portions 133.

According to the exemplary embodiment, a total (t5+t6) of the depth t5 of the first recessed portion 132 and the depth t6 of the second recessed portion 133 is less than the thickness t4 of the light transmissive base 111. For example, as illustrated in FIG. 9, the first and second recessed portions 132 and 133 may be randomly arranged, so some of first recessed portions 132 may be horizontally offset with respect to the second recessed portions 133.

Hereinafter, a polarization film 109 according to an exemplary embodiment will be described hereinafter with reference to FIG. 10.

Figure 10:
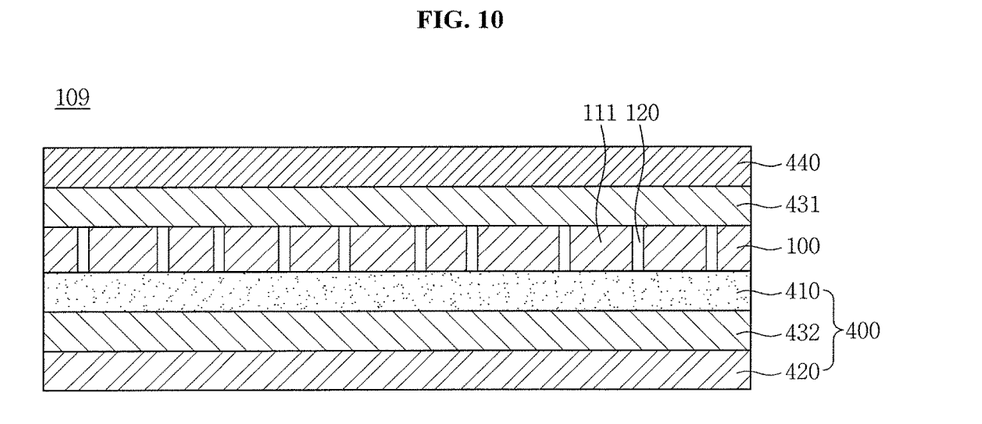
FIG. 10 illustrates a cross-sectional view of a polarization film according to an exemplary embodiment.

Referring to FIG. 10, the polarization film 109 according to the exemplary embodiment may include a polarizer 400 and a light scattering film 100 on the polarizer 400. The polarizer 400 may include a linear polarizer 410 and a retardation plate 420 on the linear polarizer 410. For example, the linear polarizer 410 may be between the light scattering film 100 and the retardation plate 420. The light scattering film 100 may be any one of the light scattering films 101, 102, 103, 104, 105, 106, 107, and 108 described previously with reference to FIGS. 1-9.

According to the exemplary embodiment, the light scattering film 100 may include the light transmissive base 111 having, for example, the plurality of holes 120, with each of the holes 120 having a diameter ranging from about 100 nm to about 5 μm. In another exemplary embodiment, the light scattering film 100 may include the light transmissive base 111 having a plurality of recessed portions, with each of the recessed portions may have a diameter ranging from about 100 nm to about 5 μm.

The polarization film 109 according to the exemplary embodiment may include first and second supporting members 431 and 432. The first and second supporting members 431 and 432 may include, e.g., a triacetylcellulose (TAC) film.

The positions to dispose the first and second supporting members 431 and 432 are not particularly limited. For example, referring to FIG. 10, the first supporting member 431 may be disposed on the light scattering film 100, and the second supporting member 432 may be disposed between the linear polarizer 410 and the retardation plate 420. The first and second supporting members 431 and 432 may be omitted. Although not illustrated, a supporting member may be disposed between the light scattering film 100 and the linear polarizer 410.

A hard coating layer 440 may be disposed on the first supporting member 431. The hard coating layer 440 protects the polarizer 400 and the light scattering film 100.

The linear polarizer 410 linearly polarizes external light incident to the light scattering film 100. The linear polarizer 410 may use a film that is formed by orienting dichroic dyes on a polyvinyl alcohol (PVA) resin in an absorption manner. However, the linear polarizer 410 is not limited thereto.

A thickness of the linear polarizer 410 may vary based on a product to which the polarization film 109 is to be applied. For example, the linear polarizer 410 may have a thickness ranging from about 5 μm to about 50 μm. The linear polarizer 410 may use any suitable products.

The retardation plate 420 may be disposed on a surface of the linear polarizer 410. When the polarization film 109 is attached to a display panel, the retardation plate 420 may be disposed more adjacent to the display panel than the linear polarizer 410 is thereto, e.g., the retardation plate 420 may be between the display panel and the linear polarizer 410.

The retardation plate 420 retards, e.g., delays, the phase of light. The retardation plate 420 may convert linearly polarized light into circularly polarized light, or may convert circularly polarized light into linearly polarized light. For example, light externally incident on the polarization film 109 may be linearly polarized by the linear polarizer 410 and circularly polarized by the retardation plate 420. The circularly-polarized external light is reflected in the display panel, thus changed in terms of a phase direction, and fails to propagate through the polarization film 109 to be dissipated.

The retardation plate 420 may include a quarter wave plate ("QWP"). The QWP may be manufactured through elongation of a film. For example, the QWP may be manufactured through elongation of a film including, e.g., polycarbonate, polyvinyl alcohol, polystyrene, polymethyl methacrylate, polypropylene, polyolefin, polyarylate, or polyamide.

In addition, the QWP may include a film having a cyclic olefin polymer (COP). The COP film has high light transmittance, high thermal resistance, high strength, low moisture absorptiveness, and low cost to make for an economic use. The retardation plate including the COP film may exhibit a relatively constant phase retardation value regardless of the wavelength of incident light.

The QWP may include a photocurable liquid crystal compound. For example, an alignment layer is formed on a base film, and a liquid crystal compound is aligned on the alignment layer to be patterned such that the QWP may be formed. The kinds of and methods of manufacturing the QWP are not particularly limited. Any suitable products that may be used as the QWP according to exemplary embodiments.

In addition, the retardation plate 420 may further include a half wave plate ("HWP") in addition to the QWP.

In general, the QWP is designed to be most suitable to phase-shift an external light incident from the front, i.e., an external light that is incident perpendicularly to a surface of the polarization film 109. Accordingly, when only the QWP is used as the retardation plate 420, an external light incident on to liquid crystal display ("LCD") devices at a predetermined inclination angle may not be desirably phase-shifted. That is, a light path of an external light may vary based on an incident angle of the external light, and thus phase retardation effects may vary based on the incident angle of the external light. In order to avoid the varying phase retardation effects, the HWP may further be used in addition to the QWP.

Figure 11:
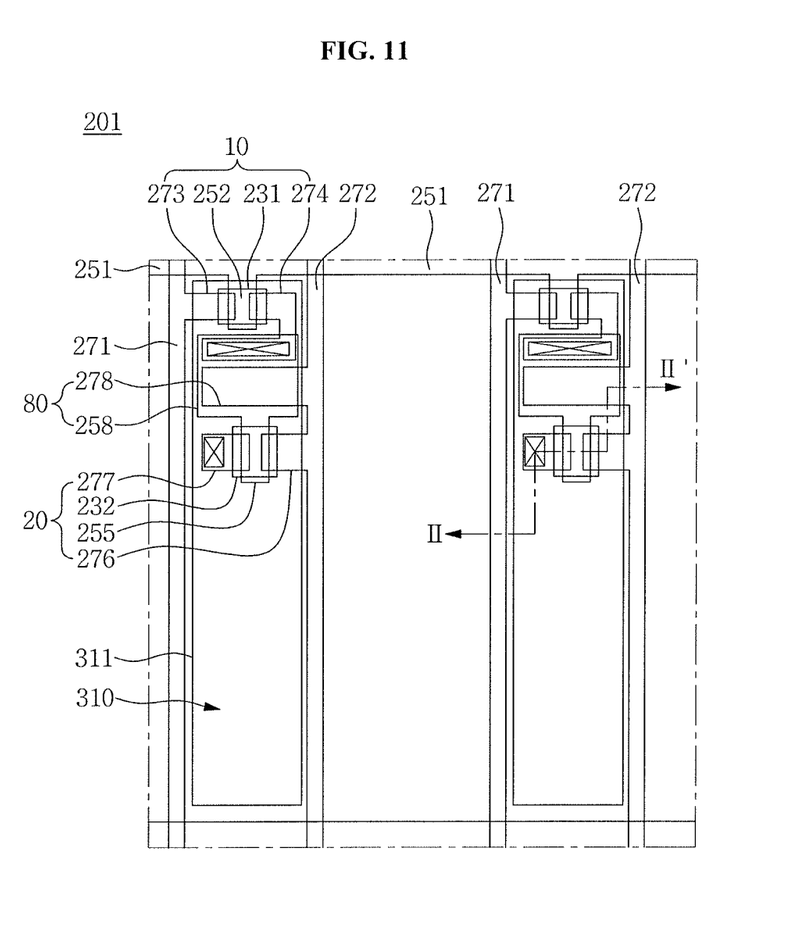
FIG. 11 illustrates a planar configuration view of a display device according to an exemplary embodiment.
Figure 12:
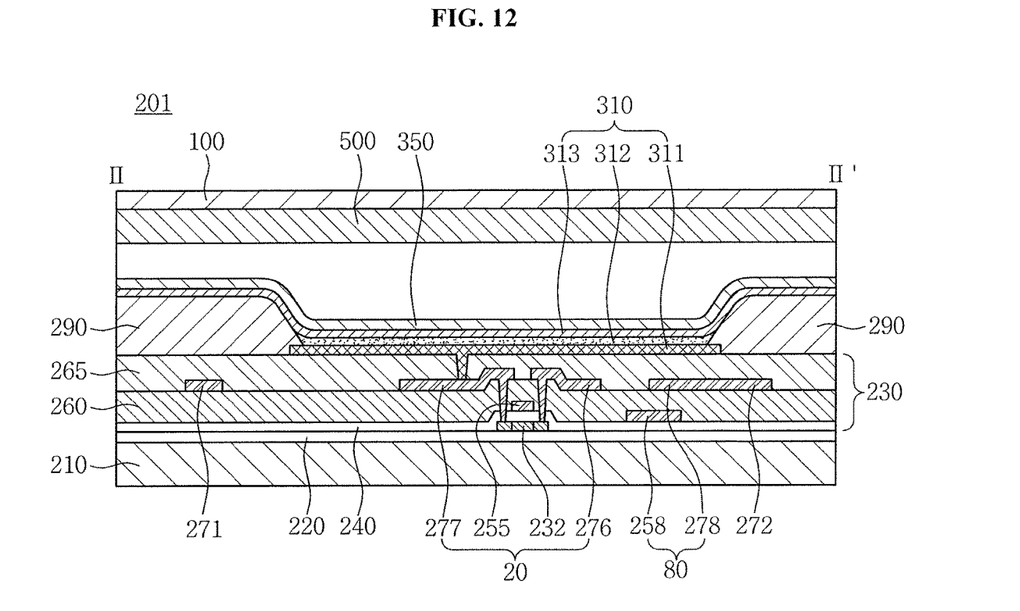
FIG. 12 illustrates a cross-sectional view taken along line II-IP of FIG. 11.

Hereinafter, a display device according to another exemplary embodiment will be described with reference to FIGS. 11 and 12. FIG. 11 is a planar configuration illustrating a display device according to the exemplary embodiment, and FIG. 12 is a cross-sectional view taken along line II-II' of FIG. 11. The display device according to the exemplary embodiment is an organic light emitting diode ("OLED") display device 201.

As illustrated in FIGS. 11 and 12, the OLED display device 201 according to the exemplary embodiment may include a substrate 210, a driving circuit unit 230, an OLED 310, a protection layer 350, a window 500, and a light scattering film 100.

The substrate 210 may include an insulating material, e.g., glass, quartz, ceramic, plastic, or the like. However, the exemplary embodiment is not limited thereto, e.g., the substrate 210 may include a metal material such as stainless steel.

A buffer layer 220 is disposed on the substrate 210. The buffer layer 220 may include at least one layer selected from various inorganic layers and organic layers. The buffer layer 220 may be omitted.

The driving circuit unit 230 is disposed on the buffer layer 220. The driving circuit unit 230 includes a plurality of thin film transistors (TFTs) 10 and 20 and drives the OLED 310.

That is, the OLED 310 emits light based on a driving signal applied from the driving circuit unit 230, thereby displaying images.

FIGS. 11 and 12 illustrate an active matrix-type organic light emitting diode (AMOLED) display device 201 having a 2Tr-1Cap structure. For example, the 2Tr-1Cap structure may include two TFTs, e.g., a switching TFT 10 and a driving TFT 20, and one capacitor 80 in each pixel, but the exemplary embodiment is not limited thereto. For example, the OLED display device 201 may include three or more TFTs and two or more capacitors in each pixel, and may further include additional wirings. Herein, the term "pixel" refers to a smallest unit for displaying an image, and the OLED display device 201 displays an image using a plurality of pixels.

Each pixel includes the switching TFT 10, the driving TFT 20, the capacitor 80, and the OLED 310. Configurations of the switching TFT 10, the driving TFT 20, and the capacitor 80 are collectively referred to as the driving circuit unit 230. In addition, a gate line 231 extending along a direction, and a data line 271 and a common power line 272 insulated from and intersecting the gate line 251 are disposed in the driving circuit unit 230. Each pixel may be defined by the gate line 251, the data line 271, and the common power line 272 as a boundary, but exemplary embodiments are not limited thereto. The pixels may be defined by a pixel defining layer or a black matrix.

The OLED 310 includes a first electrode 311, a light emitting layer 312 on the first electrode 311, and a second electrode 313 on the light emitting layer 312. The light emitting layer 312 may include a low molecular weight organic layer or a high molecular weight organic layer. Holes and electrons are applied from the first electrode 311 and the second electrode 313, respectively, into the light emitting layer 312 and then combined with each other therein to form an exciton. The OLED 310 may emit light by energy generated when the exciton falls from an excited state to a ground state.

The capacitor 80 includes a pair of capacitor plates 258 and 278, having an insulating interlayer 260 interposed therebetween. In such an exemplary embodiment, the insulating interlayer 260 may be a dielectric element. A capacitance of the capacitor 80 is determined by electric charges accumulated in the capacitor 80 and a voltage across the pair of capacitor plates 258 and 278.

The switching TFT 10 includes a switching semiconductor layer 231, a switching gate electrode 252, a switching source electrode 273, and a switching drain electrode 274. The driving TFT 20 includes a driving semiconductor layer 232, a driving gate electrode 255, a driving source electrode 276, and a driving drain electrode 277. A gate insulating layer 240 is further provided to insulate the semiconductor layers 231 and 232 and the gate electrodes 252 and 255.

The switching TFT 10 may function as a switching element which selects a pixel to perform light emission. The switching gate electrode 252 is connected to the gate line 251, and the switching source electrode 273 is connected to the data line 271. The switching drain electrode 274 is spaced apart from the switching source electrode 273 and connected to one of the capacitor plates, e.g., the capacitor plate 258.

The driving TFT 20 applies a driving power, which allows the light emitting layer 312 of the OLED 310 in a selected pixel to emit light, to the first electrode 311 which is a pixel electrode. The driving gate electrode 255 is connected to the capacitor plate 258 that is connected to the switching drain electrode 274. Each of the driving source electrode 276 and the other of the capacitor plates, e.g., the capacitor plate 278, is connected to the common power line 272. The driving drain electrode 277 is connected to the first electrode 311 of the OLED 310 through a contact hole defined in a planarization layer 265.

With the above-described structure, the switching TFT 10 is operated based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80, and a current corresponding to the voltage stored in the capacitor 80 flows to the OLED 310 through the driving TFT 20 such that the OLED 310 may emit light.

According to the exemplary embodiment, the first electrode 311 may include a reflective layer, and the second electrode 313 may include a transflective layer. Accordingly, light generated in the light emitting layer 312 may pass through the second electrode 313 to be emitted outwards. That is, the OLED display device 201 according to the exemplary embodiment has a top-emission type structure.

At least one of a hole injection layer HIL and a hole transporting layer HTL may further be disposed between the first electrode 311 and the light emitting layer 312, and at least one of an electron transporting layer ETL and an electron injection layer EIL may further be disposed between the light emitting layer 312 and the second electrode 313. The light emitting layer 312, the hole injection layer HIL, the hole transporting layer HTL, the electron transporting layer ETL, and the electron injection layer EIL may include an organic material, and thus may be referred to as an organic layer.

A pixel defining layer 290 has an aperture. The aperture of the pixel defining layer 290 exposes a portion of the first electrode 311. The first electrode 311, the light emitting layer 312, and the second electrode 313 are sequentially stacked in the aperture of the pixel defining layer 290. In such an exemplary embodiment, the second electrode 213 may also be disposed on the pixel defining layer 290 as well as on the light emitting layer 312. In addition, the HIL, the HTL, the ETL, and the EIL may also be disposed between the pixel defining layer 290 and the second electrode 313. The OLED 310 emits light from the light emitting layer 312 in the aperture of the pixel defining layer 290. As such, the pixel defining layer 290 may define a light emission area.

The protection layer 350 is disposed on the second electrode 313. The protection layer 350 protects the OLED 310 from the external environment. The protection layer 350 may also be referred to as a capping layer. In addition, a thin film encapsulation layer (not illustrated) in which an inorganic thin film and an organic thin film are alternately stacked may be disposed on the protection layer 350.

The window 500 is disposed on the protection layer 350. The window 500, along with the substrate 210, is configured to seal the OLED 310. The window 500, similar to the substrate 210, may include an insulating material, e.g., glass, quartz, ceramic, plastic, and the like. Configurations from the substrate 210 to the window 500 are collectively referred to as a display panel or an organic light emitting panel. In addition, an upper surface of the window 500 in FIG. 12 corresponds to a display surface of the organic light emitting panel.

The light scattering film 100 is disposed on the window 500. The light scattering film 100 may be any one of the light scattering films 101, 102, 103, 104, 105, 106, 107, and 108 described previously. The light scattering film 100 may improve color reproducibility and visibility from the lateral side of the OLED display device 201.

However, the exemplary embodiment is not limited thereto, and the polarization film 109 according to the exemplary embodiment may be disposed on the window 500. The polarization film 109 may prevent reflection of external light incident to the OLED display device 201. In addition, as the polarization film 109 includes the light scattering film 100, the polarization film 109 may improve color reproducibility and visibility from the lateral side of the OLED display device 201.

Figure 13:
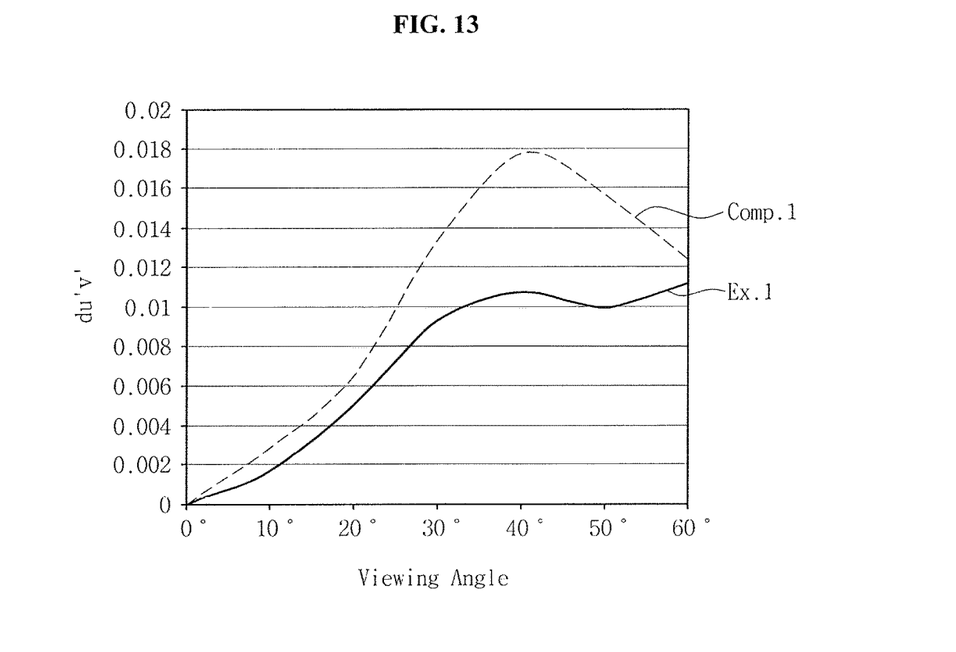
FIG. 13 illustrates a graph of side visibility improvement of an organic light emitting diode ("OLED") display device.

Hereinafter, color shift characteristics of the OLED display device 201 will be described with reference to FIG. 13. FIG. 13 is a graph illustrating side visibility improvement of an OLED display device.

A color shift (du'v') is measured, using an OLED display device (Experimental Example 1, hereinafter "EX. 1") in which the polarization film 109 according to the exemplary embodiment is disposed on a display surface of the organic light emitting panel and an OLED display device (Comparative Example 1, hereinafter "Comp. 1") in which the polarization film 109 according to the exemplary embodiment is absent from the display surface of the organic light emitting panel.

In FIG. 13, a viewing angle is defined as an angle between a normal line of the display surface of the OLED display device and a line of sight of a user. Accordingly, the viewing angle of 0° corresponds to a case that the user views the OLED display device from the front.

The color shift (du'v') is defined as a deviation degree of chromaticity coordinates of a white color in accordance with the viewing angle from chromaticity coordinates of sRGB broadcast standard.

Referring to FIG. 13, as the viewing angle increases, the color shift (du'v') substantially increases on the whole. However, it shows that a degree of the color shift (du'v') of EX. 1 employing the polarization film 109 is less than that of Comp. 1 not having the polarization film 109. In particular, at the viewing angle of about 40°, the color shift (du'v') of Ex. 1 is less than the color shift (du'v') of Comp. 1 by about 40% of the color shift (du'v') of Comp. 1.

As such, when the polarization film 109 according to the exemplary embodiment is used, the color shift of OLED display devices may be reduced. Accordingly, white angular dependency (WAD) of a white color based on the viewing angle may be reduced. That is, a polarizer including one of the light scattering films 101, 102, 103, 104, 105, 106, 107, and 108 described previously may reduce WAD of OLED display devices. Similarly, the light scattering films 101, 102, 103, 104, 105, 106, 107, and 108 described previously may reduce WAD of OLED display devices.

By way of summation and review, a light scattering film according to embodiments has excellent light scattering characteristics and, thus, may improve color shift and visibility from the lateral side of a display device. In addition, a display device including the light scattering film has excellent side visibility and display properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light scattering film, comprising:
a light transmissive base; and
a plurality of holes that extend through the light transmissive base in a direction perpendicular to an upper surface of the light transmissive base, a gap being defined between every two adjacent ones of the plurality of holes to have a plurality of gaps,
wherein each of the plurality of holes has a diameter ranging from about 100 nm to about 5 μm, and wherein each of the plurality of gaps has a width that is about two times to about five times of an average of the diameters of the plurality of holes, and
wherein the plurality of gaps have different widths.

2. The light scattering film as claimed in claim 1, wherein the plurality of holes have a density ranging from about $1 \times 10^7/cm^2$ to about $5 \times 10^8/cm^2$.

3. The light scattering film as claimed in claim 1, wherein an interior of each of the holes has a refractive index different from a refractive index of the light transmissive base, and wherein the diameter of the holes and a difference in refractive indexes of the interior of the holes and the light transmissive base are to produce light scattering at side walls of the holes that mix collimated light and diffused light to achieve a predetermined haze value.

4. The light scattering film as claimed in claim 1, wherein each of the plurality of holes has a curved portion along a thickness direction of the light transmissive base.

5. The light scattering film as claimed in claim 1, wherein the light transmissive base includes at least one of a polyimide (PI)-based resin, a polyethylene terephthalate (PET)-based resin, a polyester (PE)-based resin, a polystyrene (PS)-based resin, an acrylic resin, a polycarbonate (PC)-based resin, and a cycloolefin polymer (COP).

6. A light scattering film, comprising:
a light transmissive base having a plurality of first recessed portions defined in a first surface, wherein each of the plurality of first recessed portions has a smaller depth than a thickness of the light transmissive base and each of the plurality of first recessed portions has a diameter ranging from about 100 nm to about 5 μm, and wherein the light transmissive base further includes a plurality of second recessed portions in a second surface, the plurality of second recessed portions offset relative to the plurality of first recessed portions.

7. The light scattering film as claimed in claim 6, wherein a gap among adjacent ones of the plurality of first recessed portions is about two times to about five times of an average of the diameters of the plurality of first recessed portions.

8. The light scattering film as claimed in claim 6, wherein the second recessed portion has a smaller depth than the thickness of the light transmissive base, and the second recessed portion has a diameter ranging from about 100 nm to about 5 μm.

9. The light scattering film as claimed in claim 8, wherein the second surface is opposite the first surface, and a total depth of one first recessed portion and one second recessed portion is smaller than the thickness of the light transmissive base.

10. A polarization film, comprising:
a polarizer; and
a light scattering film on the polarizer,
wherein the polarizer includes a linear polarizer and a retardation plate on the linear polarizer, and wherein the light scattering film includes a light transmissive base having a plurality of holes extending in a direction perpendicular to an upper surface of the light transmissive base, and
wherein each of the plurality of holes has a diameter ranging from about 100 nm to about 5 μm and passes through the light transmissive base, and distances among the plurality of holes vary.

11. The polarization film as claimed in claim 10, wherein a gap among the plurality of holes is about two times to about five times of an average of the diameters of the plurality of holes.

12. The polarization film as claimed in claim 10, wherein the plurality of holes have a density ranging from about $1 \times 10^7/cm^2$ to about $5 \times 10^8/cm^2$.

13. The polarization film as claimed in claim 10, wherein the retardation plate includes a quarter wave plate.

14. The polarization film as claimed in claim 13, wherein the retardation plate further includes a half wave plate.

15. A display device, comprising:
a display panel; and
a light scattering film in a display area of the display panel, the light scattering film including:
a light transmissive base, and
a plurality of holes passing through a first surface and a second surface of the light transmissive base, a plurality of gaps among the plurality of holes having different widths,
wherein each of the plurality of holes has a diameter ranging from about 100 nm to about 5 μm, and wherein each gap of the plurality of gaps has a width about two times to about five times of an average of the diameters of the plurality of holes.

16. The display device as claimed in claim 15, wherein the display panel includes:
a first electrode on a substrate;
a light emitting layer on the first electrode;
a second electrode on the light emitting layer; and
a window above the second electrode, the window being between the second electrode and the light scattering film.

17. The display device as claimed in claim 15, further comprising a polarizer between the display panel and the light scattering film.

18. The display device as claimed in claim 15, wherein the plurality of holes have different diameters.

19. The display device as claimed in claim 15, wherein a central axis of each hole of the plurality of holes has an inclination angle with respect to a normal to the light transmissive base.

20. The display device as claimed in claim 19, wherein the inclination angle is in a range from about 20° to about 40°.

21. The display device as claimed in claim 15, wherein the plurality of holes includes:
a first inclined hole having a first inclination angle with respect to a normal to the light transmissive base; and
a second inclined hole having a second inclination angle with respect to the normal to the light transmissive base.

22. The display device as claimed in claim 21, wherein the first inclined hole and the second inclined hole intersect each other.

* * * * *